United States Patent
Park et al.

(10) Patent No.: US 9,374,100 B2
(45) Date of Patent: Jun. 21, 2016

(54) LOW POWER LO DISTRIBUTION USING A FREQUENCY-MULTIPLYING SUBHARMONICALLY INJECTION-LOCKED OSCILLATOR

(75) Inventors: Dongmin Park, Santa Clara, CA (US);
Jafar Savoj, Santa Clara, CA (US)

(73) Assignee: Qualcomm Incorporated, San Diego, CA (US)

(*) Notice: Subject to any disclaimer, the term of this patent is extended or adjusted under 35 U.S.C. 154(b) by 399 days.

(21) Appl. No.: 12/496,422

(22) Filed: Jul. 1, 2009

(65) Prior Publication Data

US 2011/0003571 A1    Jan. 6, 2011

(51) Int. Cl.
| | | |
|---|---|---|
| H04B 1/06 | (2006.01) | |
| H03L 7/24 | (2006.01) | |
| H03B 27/00 | (2006.01) | |
| H03B 5/12 | (2006.01) | |

(52) U.S. Cl.
CPC .............. *H03L 7/24* (2013.01); *H03B 5/1215* (2013.01); *H03B 5/1228* (2013.01); *H03B 27/00* (2013.01); *H03B 2200/007* (2013.01); *H03B 2200/0074* (2013.01); *H03B 2200/0078* (2013.01); *H03B 2200/0082* (2013.01)

(58) Field of Classification Search
USPC .......................... 455/258, 76, 146; 331/47, 46
See application file for complete search history.

(56) References Cited

U.S. PATENT DOCUMENTS

| | | | |
|---|---|---|---|
| 3,109,148 A * | 10/1963 | Siegal ............................ 331/14 |
| 4,238,796 A * | 12/1980 | Mawhinney ................. 342/199 |
| 5,530,929 A * | 6/1996 | Lindqvist et al. ............. 455/324 |
| 5,546,056 A * | 8/1996 | Tokumitsu ..................... 331/172 |
| 5,561,398 A * | 10/1996 | Rasmussen ................. 331/36 C |
| 7,376,206 B1 | 5/2008 | Simic et al. | |

(Continued)

FOREIGN PATENT DOCUMENTS

| | | |
|---|---|---|
| CN | 1045496 A | 9/1990 |
| JP | 2001086024 A | 3/2001 |

(Continued)

OTHER PUBLICATIONS

5. A. W. L. Ng and H. C. Luong "A 1-V 17-GHz 5-mW CMOS quadrature VCO based on transformer coupling", IEEE J. Solid-State Circuits, vol. 42, p. 1933, 2007.*

(Continued)

*Primary Examiner* — Nay A Maung
*Assistant Examiner* — Erica Fleming-Hall
(74) *Attorney, Agent, or Firm* — Peter A. Clevenger

(57) ABSTRACT

A local oscillator communicates a signal of relatively low frequency across an integrated circuit to the location of a mixer. Near the mixer, a frequency-multiplying SubHarmonically Injection-Locked Oscillator (SHILO) receives the signal and generates therefrom a higher frequency signal. If the SHILO outputs I and Q quadrature signals, then the I and Q signals drive the mixer. If the SHILO does not generate quadrature signals, then a quadrature generating circuit receives the SHILO output signal and generates therefrom I and Q signals that drive the mixer. In one advantageous aspect, the frequency of the signal communicated over distance from the local oscillator to the SHILO is lower than the frequency of the I and Q signals that drive the mixer locally. Reducing the frequency of the signal communicated over distance can reduce power consumption of the LO signal distribution system by more than fifty percent as compared to conventional systems.

27 Claims, 12 Drawing Sheets

(56) References Cited

U.S. PATENT DOCUMENTS

| | | | |
|---|---|---|---|
| 2002/0113660 | A1 | 8/2002 | Dally et al. |
| 2002/0163391 | A1* | 11/2002 | Peterzell ............................ 331/25 |
| 2004/0008092 | A1* | 1/2004 | Hajimiri et al. ............ 331/117 R |
| 2005/0148310 | A1* | 7/2005 | Craninckx ...................... 455/266 |
| 2006/0083335 | A1* | 4/2006 | Seendripu et al. .............. 375/332 |
| 2006/0152290 | A1* | 7/2006 | Lee et al. .......................... 331/16 |
| 2007/0159259 | A1* | 7/2007 | Suh et al. ............................ 331/2 |
| 2007/0264945 | A1* | 11/2007 | Carrez .......................... 455/118 |
| 2008/0009258 | A1* | 1/2008 | Safarian et al. ................ 455/307 |
| 2009/0174486 | A1* | 7/2009 | Haralabidis et al. ............. 331/45 |
| 2009/0189808 | A1 | 7/2009 | Chen |
| 2009/0279592 | A1 | 11/2009 | Pratt et al. |
| 2011/0051670 | A1* | 3/2011 | Safarian et al. ................ 370/328 |
| 2011/0181332 | A1* | 7/2011 | Song et al. ...................... 327/233 |

FOREIGN PATENT DOCUMENTS

| | | |
|---|---|---|
| JP | 2001168935 A | 6/2001 |
| JP | 2005033772 A | 2/2005 |
| JP | 2005303441 A | 10/2005 |
| JP | 2007043476 A | 2/2007 |
| JP | 2007097151 A | 4/2007 |
| WO | 0241595 | 5/2002 |
| WO | 2007104131 A1 | 9/2007 |

OTHER PUBLICATIONS

7.J. F. Buckwalter , A. Babakhani , A. Komijani and A. Hajimiri "An integrated subharmonic coupled-oscillator scheme for a 60-GHz phased-array transmitter", IEEE Trans. Microw. Theory Tech., vol. 54, p. 4271 , 2006.*

Tasic, A.; Yue, S.S.Y.; Ma, D.K.L.; Serdijn, W.A.; Long, J.R.; Harame, D.L: Receiver RF front-end with 5GHz-band LC voltage-controlled oscillator and subharmonically-locked ring oscillator for 17GHz wireless applications, Radio Frequency Integrated Circuits (RFIC) Symposium, 2006 IEEE, Jun. 11-13, 2006 pp. 4 pp.*

International Search Report and Written Opinion—PCT/US2010/040843, International Search Authority—European Patent Office—Oct. 4, 2010.

Long J R et al: "A Subharmonically Injected LC Delay Line Oscillator for 17-GHz Quadrature LO Generation" IEEE Journal of Solid-State Circuits, IEEE Service Center, Piscataway, NJ, US LNKDDOI: 10.1109/JSSC.2004.831610, vol. 39, No. 9, Sep. 1, 2004, pp. 1434-1445, XP011117962 ISSN: 0018-9200.

Park, "Low Power LO Distribution", Mar. 2009.

Tam et al., "Simultaneous Sub-Harmonic Injection-Locked mm-Wave Frequency Generators for Multi-band Communications in CMOS", pp. 131-134, University of California Los Angeles, 2008.

Chen et al., "Design and Analysis of CMOS Subharmonic Injection-locked Frequency Triplers", IEEE Transactions on Microwave Theory and Techniques, vol. 56, No. 8., pp. 1869-1878, Aug. 2008.

Lee et al., "Subharmonically Injection-Locked PLLs for Ultra-Low Noise Clock Generation", ISSCC 2009, Session 5, Potpourri: PLL, Optical, DSL, 5.2, Feb. 9, 2009.

Ma et al., A Subharmonically Injected LC Delay Line Oscillator for 17-GHz Quadrature LO Generation, IEEE Journal of Solid-State Circuits, vol. 39, No. 9, pp. 1434-1445, Sep. 2004.

Park, et al., "Low Power LO Distribution", Jun. 5, 2009.

Hartmann, M. et al., "A 77 GHz SiGe Mixer Circuit with LO Active Frequency Multiplier for Automotive Radar", IEEE BCTM 14.1, Oct. 2, 2007, pp. 206-209.

Parsa, A. et al., "A 60GHz CMOS Receiver Using a 30GHz LO", IEEE International Solid-State Circuits Conference, Feb. 2008, pp. 3.

Chan W L., et al., "A 56-65 GHz Injection-Locked Frequency Tripler With Quadrature Outputs in 90-nm CMOS," Solid-State Circuits, IEEE Journal of, vol. 43, No. 12, pp. 2739-2746, Dec. 2008.

Michael H., et al., "A Low Noise Programmable Clock Multiplier based on a Pulse Injection-Locked Oscillator with a Highly-Digital Tuning Loop" ,Proceedings of IEEE Radio Frequency Integrated Circuits Symposium, 2008., Jun. 15, 2008,p. 423-426.

* cited by examiner

DIVIDE-BY-TWO AND QUADRATURE SIGNAL
GENERATOR

| | | PRIOR ART (FIGS. 1 AND 2) | | 10 GHz LCVCO + DIV2 (FIG. 6) | | 10 GHz RING OSC + DIV2 (FIG. 10) | | 5 GHz QVCO (FIG. 13) | |
|---|---|---|---|---|---|---|---|---|---|
| SUPPLY CURRENT (@ 1.3 V) | OSC | N/A | | OSC | 1 mA | OSC | 1.3 mA | OSC | 1 mA |
| | DIV2 | 0.7 mA | | DIV2 | 0.7 mA | DIV2 | 0.4 mA | DIV2 | N/A |
| | PULSE GEN | N/A | | PULSE GEN | 0.3 mA | PULSE GEN | 0.3 mA | PULSE GEN | 0.3 mA |
| | 10 GHz | 10 mA | | 2.5 GHz | 2 mA | 2.5 GHz | 2 mA | 1.25 GHz | 1 mA |
| | TOTAL | 10.7 mA | | TOTAL | 4 mA | TOTAL | 4 mA | TOTAL | 2.9 mA |
| PHASE NOISE @ 242 MHz | | | | -152 dBc/Hz | | -142 dBc/Hz | | -163 dBc/Hz | |
| I/Q MISMATCH | | | | <1 DEGREE | | <5 DEGREES | | <8 DEGREES | |
| LOCKING RANGE | | | | ~2% | | ~20% | | ~2% | |
| AREA | | | | 0.015 mm$^2$ | | 0.0001 mm$^2$ (10um x 10 um) | | 0.044 mm$^2$ | |

PERFORMANCE COMPARISON
WITH 2 MILLIMETERS BETWEEN LO AND MIXER

FIG. 16

LOW POWER LO DISTRIBUTION USING A FREQUENCY-MULTIPLYING SUBHARMONICALLY INJECTION-LOCKED OSCILLATOR

BACKGROUND INFORMATION

1. Technical Field

The disclosed embodiments relate to the communication of local oscillator (LO) signals across distances from local oscillators to mixers.

2. Background Information

In radio transmitter and receivers, a signal is sometimes generated at one location on an integrated circuit using a local oscillator. This signal is then communicated from that location and across the integrated circuit a substantial distance to a mixer at a second location on the integrated circuit. The local oscillator may be located at this distance away from the mixer to prevent the noise from the local oscillator and associated circuitry from interfering with proper operation of the mixer. The distance between the local oscillator and the mixer may be quite substantial.

FIG. 1 (Prior Art) is a simplified diagram of one example of a Radio Frequency (RF) transceiver integrated circuit 1 such as is sometimes found in cellular telephone handsets. Integrated circuit 1 is referred to as a transceiver because it includes transmitter circuitry 2 as well as receiver circuitry 3. If a signal on antenna 4 is to be received, then the signal 5 passes from antenna 4 into the receiver circuitry 3 where it is downconverted in frequency by a mixer 6. The downconversion is tuned by and controlled by two signals: an in-phase differential signal I, and a quadrature differential signal Q. The I and Q signals are generated by a combination of a remotely located local oscillator 7 and a locally located divide-by-two quadrature signal generator 8. In the illustrated example, the remotely located local oscillator 7 outputs a differential output signal. This differential signal is communicated across a pair of conductors 9 and 10 to the divide-by-two quadrature signal generator 8. The divide-by-two quadrature signal generator 8 divides the signal down by a factor of two and outputs the two differential signals I and Q signals to mixer 6. The downconverted signal 11 as output from mixer 6 is digitized by an Analog-to-Digital Converter (ADC) 12 and the resulting digital information is passed on for further receive processing.

If digital information is to be transmitted, then the digital information is converted into analog form by a Digital-to-Analog Converter (DAC) 13. The resulting analog signal 14 is upconverted in frequency by a mixer 15 in transmitter circuitry 2. A pair of differential signals I and Q controls how mixer 15 upconverts the analog signal in frequency. As in the case of the receiver circuit, the I and Q signals used by the mixer 15 are generated by a remotely located local oscillator 16 and a divide-by-two and quadrature signal generator 17 located close to mixer 15. Remotely located local oscillator 16 supplies a differential signal via a pair of conductors 18 and 19 to the divide-by-two and quadrature signal generator 17. The divide-by-two and quadrature signal generator 17 outputs the differential signals I and Q to the mixer 15. The resulting upconverted signal 20 as output by mixer 15 is amplified and is output onto antenna 4 for transmission.

FIG. 2 (Prior Art) illustrates one of these local oscillator and divide-by-two quadrature signal generator circuits in further detail. In the illustrated example, the local oscillator 7 includes a Phase-Locked Loop (PLL). The PLL in turn includes a Voltage-Controlled Oscillator (VCO) 21. VCO 21 outputs a differential output signal VO that is buffered by a buffer 22 and is communicated across distance D via the pair of conductors 9 and 10. Signal VO can be communicated by current transfer or by voltage transfer. The differential output signal VO includes a VOP signal on one of the conductors 9 and am anti-phase VON signal on the other of the conductors 10. The differential VO signal is sometimes referred to in the art as a local oscillator (LO) signal and is sometimes referred by other names such as a VCO output signal. The signal is referred to here as a VO signal ("VCO output" signal), however, because the signal is output from a VCO 21 and because the quadrature signals I and Q that actually drive mixer 6 are of a different frequency.

Divide-by-two and quadrature signal generator 8 receives the differential signal VO from conductors 9 and 10 and generates therefrom two differential signals that have a quadrature phase relationship to one another. The frequency of the two differential signals is half the frequency of the VO signal due to the divide-by-two functionality of divide-by-two quadrature signal generator 8. The two differential signals are buffered by buffers 23 and 24 to generate the I and Q differential signals that drive mixer 6. In the illustrated example, because five gigahertz I and Q signals are required at mixer 6, the VO signal as communicated from the local oscillator 7 is a ten gigahertz signal. An improvement to the signal generation and distribution circuitry of FIG. 1 and FIG. 2 is desired.

SUMMARY

In a local oscillator signal distribution system and method, a local oscillator communicates a signal of a relatively low frequency across an integrated circuit to the location of a mixer. In one example, the low frequency signal is communicated via a conductor a distance of at least one millimeter. Near the mixer, a frequency-multiplying SubHarmonically Injection-Locked Oscillator (SHILO) receives the low frequency signal and generates therefrom a higher frequency signal. If the SHILO outputs in-phase (I) and quadrature (Q) signals, then the I and Q signals output by the SHILO are used to drive the mixer. If the SHILO does not generate quadrature signals, then a quadrature generating circuit receives the SHILO output signal and generates therefrom I and Q signals that are then used to drive the mixer. In one advantageous aspect, the frequency of the relatively low frequency signal communicated across the integrated circuit from the local oscillator to the SHILO is lower than the frequency of the I and Q signals that drive the mixer locally. Reducing the frequency of the signal communicated over the distance between the local oscillator and the mixer reduces total power consumption and reduces radiated energy as compared to a conventional local oscillator signal distribution system. In a first example, the SHILO includes an injection-locked LC-based VCO. In a second example, the SHILO includes an injection-locked ring oscillator. In a third example, the SHILO includes an injection-locked Quadrature VCO (QVCO).

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or methods described herein, as defined solely by the claims, will become apparent in the non-limiting detailed description set forth herein.

BRIEF DESCRIPTION OF THE DRAWINGS

FIG. 16 is a chart that sets forth a comparison of the prior art of FIGS. 1 and 2, of the first example of FIG. 6, or the second example of FIG. 10, and of the third example of FIG. 13.

DETAILED DESCRIPTION

Figure 3:
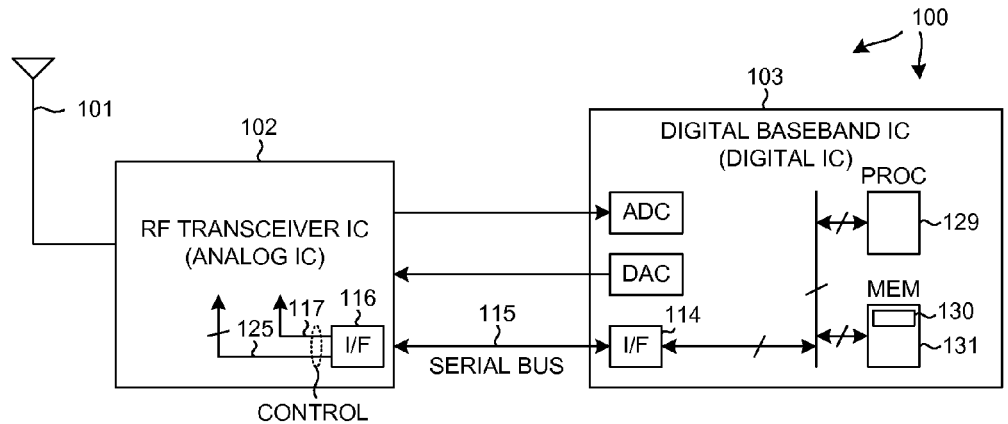
FIG. 3 is a very simplified high level block diagram of a mobile communication device 100 such as a cellular telephone.

FIG. 3 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 4:
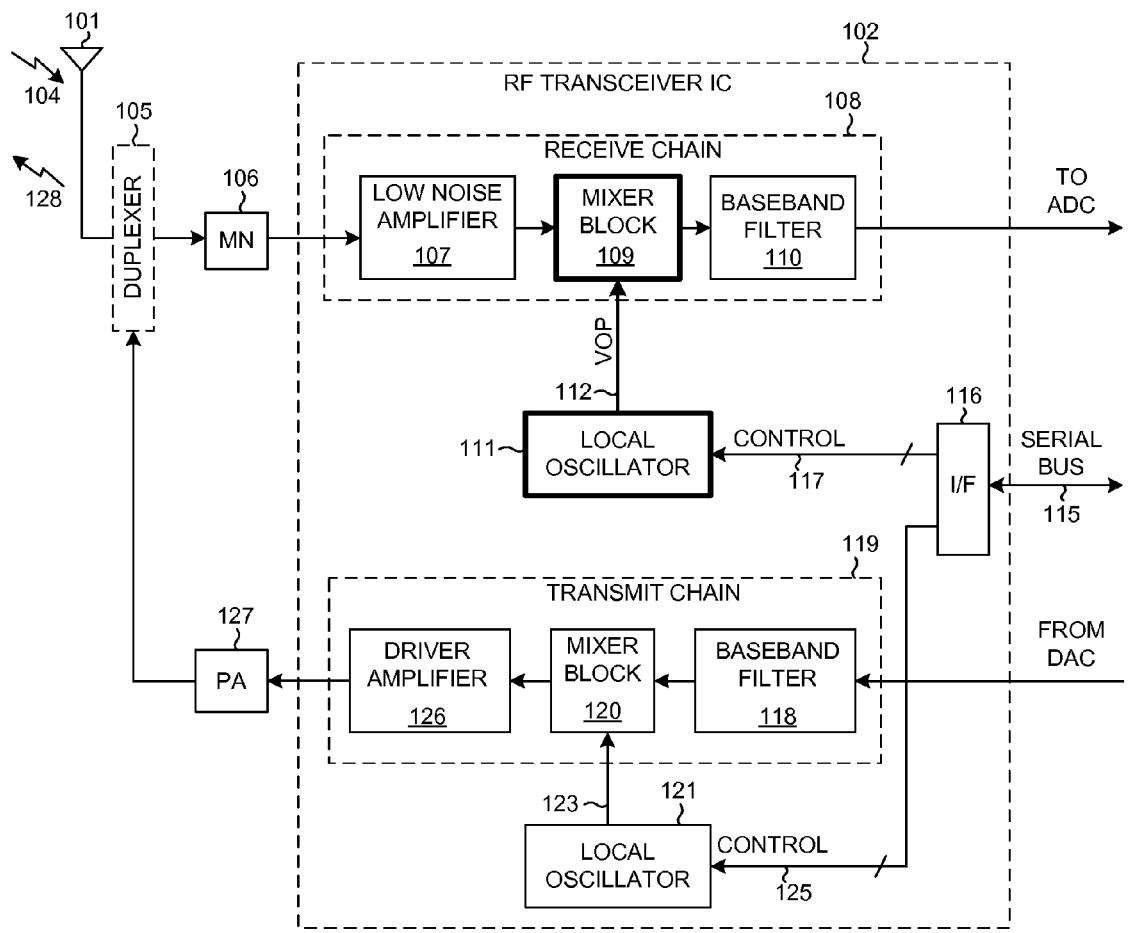
FIG. 4 is a more detailed diagram of the RF transceiver integrated circuit 102 of FIG. 3.

FIG. 4 is a more detailed diagram of the RF transceiver integrated circuit 102 of FIG. 3. In one very simplified explanation of the operation of the cellular telephone, if the cellular telephone is being used to receive audio information as part of a cellular telephone conversation, then an incoming transmission 104 is received on antenna 101. The signal passes through a duplexer 105 and a matching network 106 and is amplified by a Low Noise Amplifier (LNA) 107 of a receive chain 108. After being downconverted in frequency by a mixer in mixer block 109 and after being filtered by baseband filter 110, the information is communicated to the digital baseband integrated circuit 103 for analog-to-digital conversion and further processing in the digital domain. How the receive chain downconverts is controlled by changing the frequency of a local oscillator signal generated by local oscillator 111. This local oscillator signal LO1 (not shown in FIG. 4) actually includes two differential signals I and Q. Differential signal I is an in-phase differential signal whereas differential signal Q is a quadrature signal. As explained further below, each of these signals I and Q is a differential signal communicated across a set of two conductors. In the specific example illustrated in FIG. 4, the local oscillator signal LO1 involving these I and Q signals is actually generated within mixer block 109 from a VCO output signal VOP on conductor 112. Digital baseband integrated circuit 103 controls the frequency of the VOP signal, and thereby also controls the I and Q signals supplied to the mixer in mixer block 109, by sending control information CONTROL to local oscillator 111 via serial bus interface 114, serial bus 115, serial bus interface 116, and conductors 117.

If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 118 of a transmit chain 119 of RF transceiver integrated circuit 102. After filtering, the signal is upconverted in frequency by a mixer in mixer block 120. The upconversion process is tuned and controlled by controlling the frequency of a pair of differential I and Q quadrature signals supplied to the mixer in mixer block 120. Local oscillator 121 outputs a VCO output signal via conductor 123, and this VCO output signal is used to generate the I and Q signals that are supplied to the mixer. The signals I and Q are referred to here as a second local oscillator signal LO2. Digital baseband integrated circuit 103 controls the frequency of the VO signal on conductor 123, and thereby also controls the I and Q signals of LO2, by sending control information CONTROL to local oscillator 121 via serial bus interface 114, serial bus 115, serial bus interface 116, and conductors 125. The resulting upconverted signal output by mixer block 120 is amplified by a driver amplifier 126 and an external power amplifier 127. The amplified signal is supplied to antenna 101 for transmission as outgoing transmission 128. In this embodiment, a processor 129 executing a set of processor-executable instructions 130 out of memory 131 within digital baseband integrated circuit 103 determines the control information CONTROL and causes this control information to be communicated to local oscillators 111 and 121.

Figure 5:
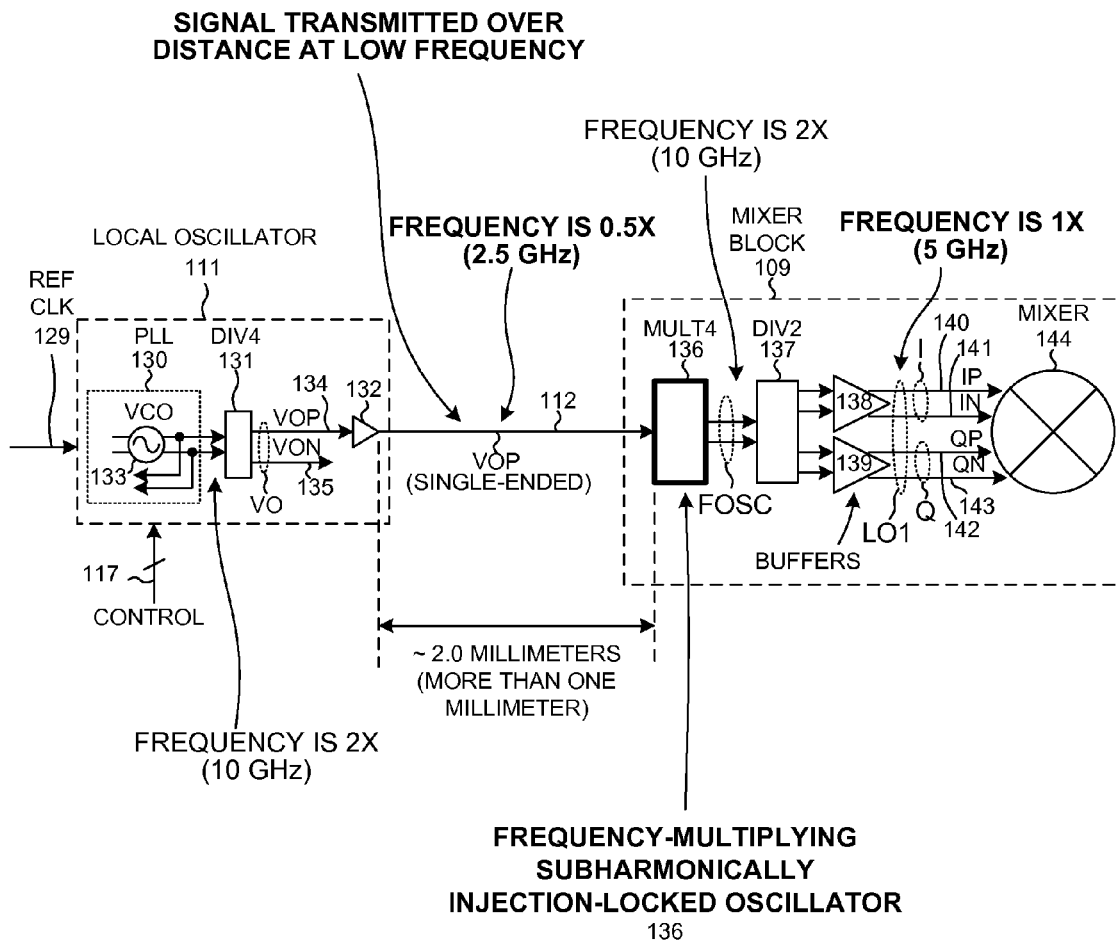
FIG. 5 is a more detailed diagram of the local oscillator 111, the conductor 112, and the mixer block 109 of FIG. 4.

FIG. 5 is a diagram that shows the local oscillator 111, conductor 112, and mixer block 109 of FIG. 4 in further detail. Local oscillator 111 receives a reference clock signal REF CLK via conductor 129 and generates therefrom the signal VOP on conductor 112, where the frequency of the signal VOP is determined by the multi-bit digital control information CONTROL on conductors 117. Local oscillator 111 includes (among other circuits not illustrated) a Phase-Locked Loop (PLL) 130, a divide-by-four divider (DIV4) 131, and a buffer 132. A Voltage Controlled Oscillator (VCO) 133 of PLL 130 outputs a differential VCO output signal that is supplied to divider 131. Divider 131 performs a frequency division divide-by-four function and outputs a differential output signal VO. Differential signal VO in this example includes signal VOP on conductor 134 and signal VON on conductor 135. The VOP signal on conductor 134 is buffered by buffer 132 and is output from local oscillator 111 as a single-ended periodic VCO output signal VOP on conductor 112.

In the specific example illustrated, periodic signal VCO 133 oscillates at 10 GHz, and divider 131 divides by four, so the frequency of the periodic signal VOP on conductor 112 is 2.5 GHz. The 10 GHz and 2.5 GHz frequencies mentioned here are the fundamentals of their respective periodic signals.

The 2.5 GHz periodic VOP signal on conductor 112 is communicated a substantial distance across integrated circuit 102 from the location of local oscillator 111 to the location of mixer block 109. In the present example, this distance is approximately two millimeters. At the location of mixer block 109, the signal VOP is received onto a frequency-multiplying SubHarmonically Injection-Locked Oscillator (SHILO) 136. SHILO 136, by receiving VOP signal, is made to oscillate at an integer multiple of the frequency of the incoming VOP signal on conductor 112. In the present example, this integer multiple is four. SHILO 136 therefore oscillates at 10 GHz and outputs a 10 GHz differential output signal FOSC. A divide-by-two and quadrature signal generating circuit 137 receives the 10 GHz signal FOSC and generates therefrom two differential signals. Because divide-by-two and quadrature signal generating circuit 137 frequency divides by two, the frequency of these two differential signals in this example is 5 GHz. Each of these differential signals is buffered by a respective one of a pair of buffers 138 and 139. Buffer 138 supplies the 5 GHz in-phase differential signal I via conductors 140 and 141 to the mixer 144 within mixer block 109. Buffer 139 supplies the 5 GHz quadrature differential signal Q via conductors 142 and 143 to the mixer 144.

Accordingly, mixer 144 is driven with 5 GHz I and Q signals even though the frequency of the signal VOP communicated from local oscillator 111 to mixer block 109 is of a lower frequency (2.5 GHz in this case). In the prior art of FIG. 2, on the other hand, the differential signal communicated from local oscillator 7 to receiver 3 is a much higher 10 GHz. By reducing the frequency of the signal communicated the relatively large distance from the local oscillator to the mixer using the teaching of this patent document, the amount of power radiated from the long conductor is reduced and the charging and discharging of parasitics is reduced. As described in further detail below, power consumption is reduced as compared to the circuit of FIG. 2. Although is presently described specific example of FIG. 5 involves driving a mixer with a 5 GHz signal, this is but one example. The presently described method and circuit is usable to drive a mixer with any frequency.

Figure 6:
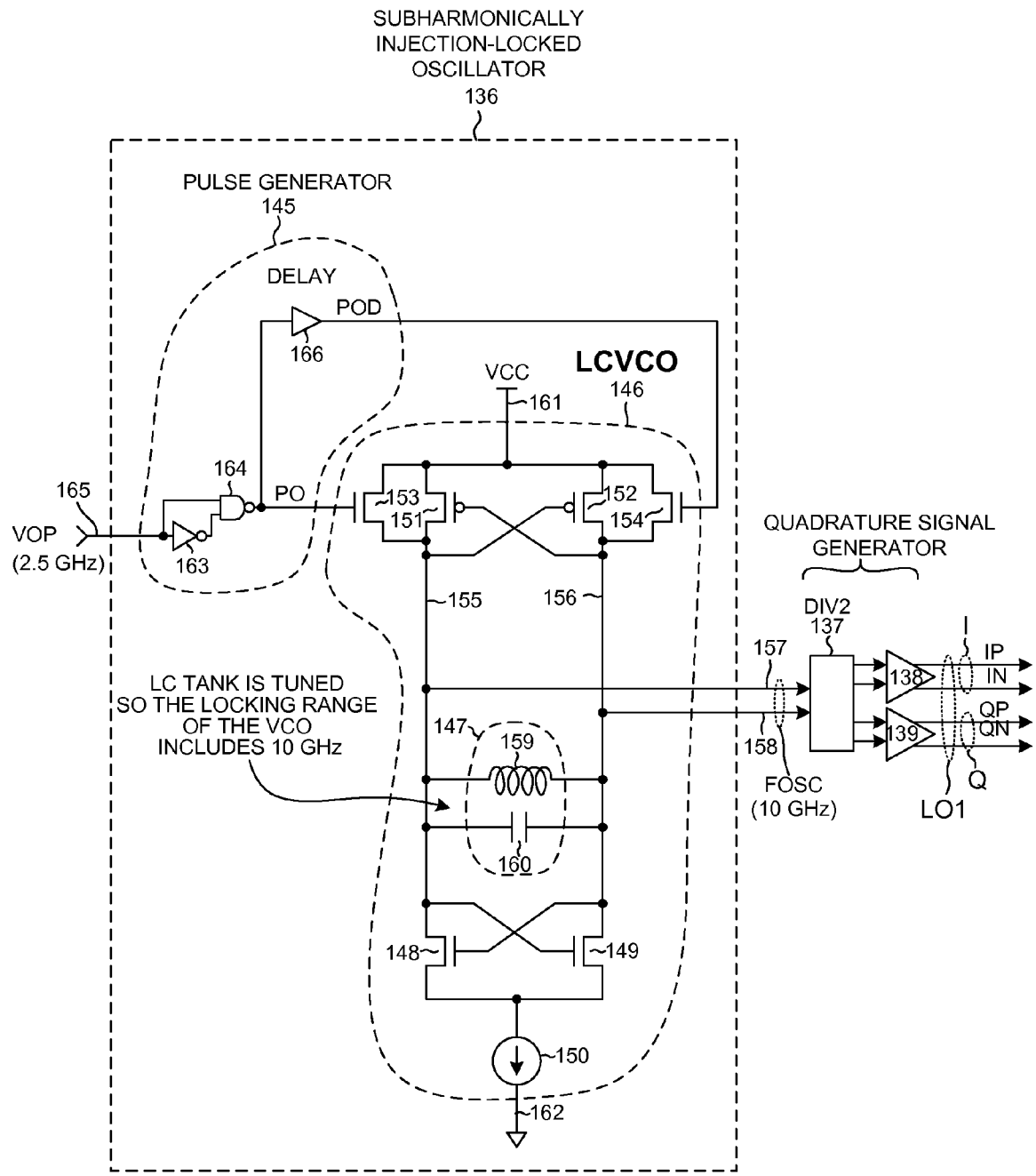
FIG. 6 is a circuit diagram of a first example of the Sub-Harmonically Injection-Locked Oscillator (SHILO) 136 in the circuit of FIG. 5.

FIG. 6 is a circuit diagram of a first example of SHILO 136 of FIG. 5. SHILO 136 includes a pulse generator circuit 145 and a LC-based VCO 146. The LC-based VCO 146 includes an LC tank 147, a cross-coupled pair of N-channel transistors 148 and 149, a current source 150, a cross-coupled pair of P-channel transistors 151 and 152, and a pair of signal injection P-channel transistors 153 and 154. The sources of P-channel transistors 151-154 are coupled to a supply voltage node 161 as illustrated. Current source 150 conducts a current from the sources of N-channel transistors 148 and 149 to a ground node 162. The output nodes of the LC-based VCO 146 are nodes 155 and 156. The 10 GHz signal FOSC is present between nodes 156 and 156. Reference numeral 157 identifies a first output lead of the LC-based VCO 146. This lead 157 is an extension of output node 155. Similarly, reference numeral 158 identifies a second output lead of the LC-based VCO 146. This lead 158 is an extension of node 156. The input nodes of LC-based VCO 146 include the gates of P-channel signal injection transistors 153 and 154, respectively. LC tank 147 includes a parallel-connected inductor 159 and capacitor 160. The inductance and capacitance of tank circuit 147 are fixed such that the locking range of the VCO 146 includes 10 GHz but does not include any other integer multiple of 2.5 GHz.

Pulse generator circuit 145 includes pulse generating logic gates 163 and 164 that receive the VOP signal from conductor 112 (see FIG. 5) via input lead 165 and generate a pulse output signal PO, and supply the pulse output signal PO onto the gate of P-channel signal injection transistor 153 of the LC-based VCO 146. A delay logic element 166 generates a delayed version of the PO signal POD, and supplies the delayed pulse output signal POD to the gate of P-channel signal injection transistor 154 of the LC-based VCO 146. Whereas the VOP signal on conductor 112 may not have a 10 GHz frequency component, or may not have a 10 GHz frequency component of adequate magnitude, the pulse generator circuit 145 outputs pulse streams PO and POD that do have substantial 10 GHz frequency components. Because the LC-based VCO is tuned to have a locking range that includes 10 GHz, the LC-based VCO locks onto the injected 10 GHz frequency component and oscillates at 10 GHz, therefore frequency multiplying the incoming 2.5 GHz signal on input lead 165 by four.

Figure 7:
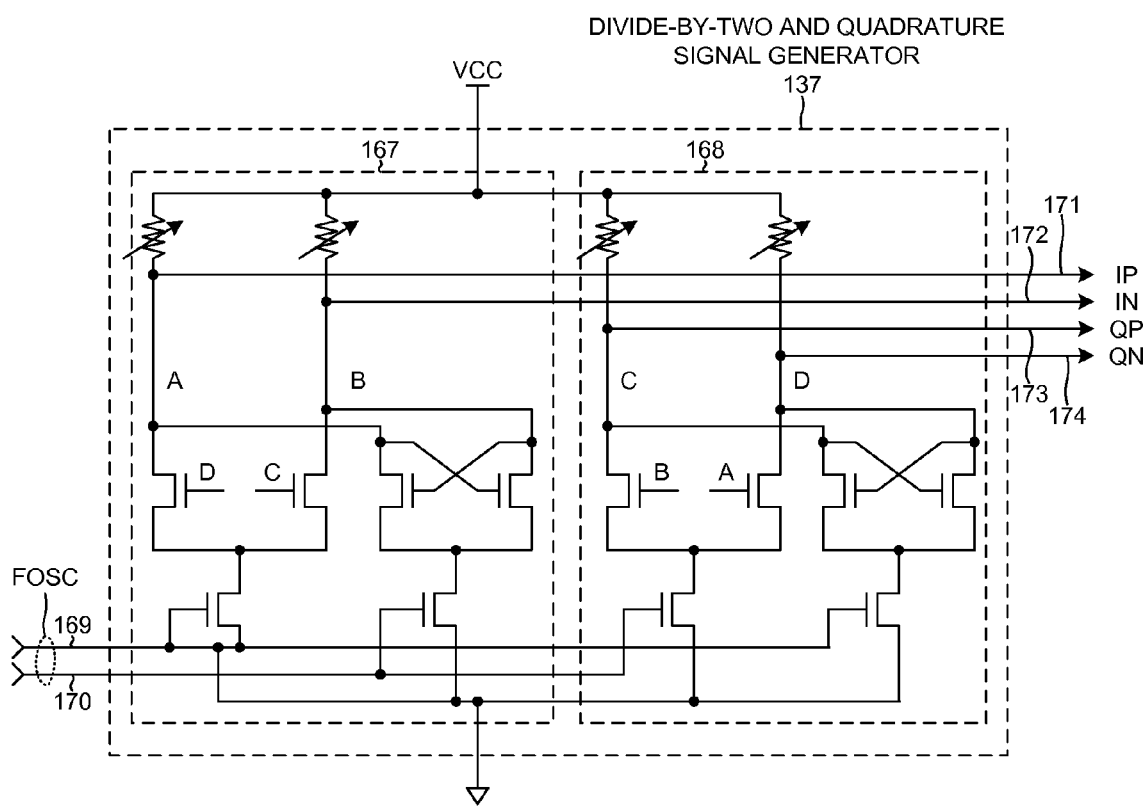
FIG. 7 is a circuit diagram of an example of the divide-by-two and quadrature signal generator 137 of FIG. 5.

FIG. 7 is a circuit diagram of one example of a suitable implementation of the divide-by-two and quadrature signal generator 137 of FIG. 5. The divide-by-two and quadrature generator 137 includes two differential latches 167 and 168, interconnected as illustrated. The signal FOSC as output by SHILO 136 of FIG. 6 is received onto the divide-by-two and quadrature generator 137 of FIG. 7 via input leads 169 and 170. In this example, output node 155, output lead 157, and input lead 169 all form one node. Similarly, output node 156, output lead 158, and input lead 170 all form one node. The I differential signal supplied to buffer 138 in FIG. 6 is output onto the output leads 171 and 172 illustrated in FIG. 7. Similarly, the Q differential signal supplied to buffer 139 in FIG. 6 is output onto output leads 172 and 173 illustrated in FIG. 7.

Figure 8:
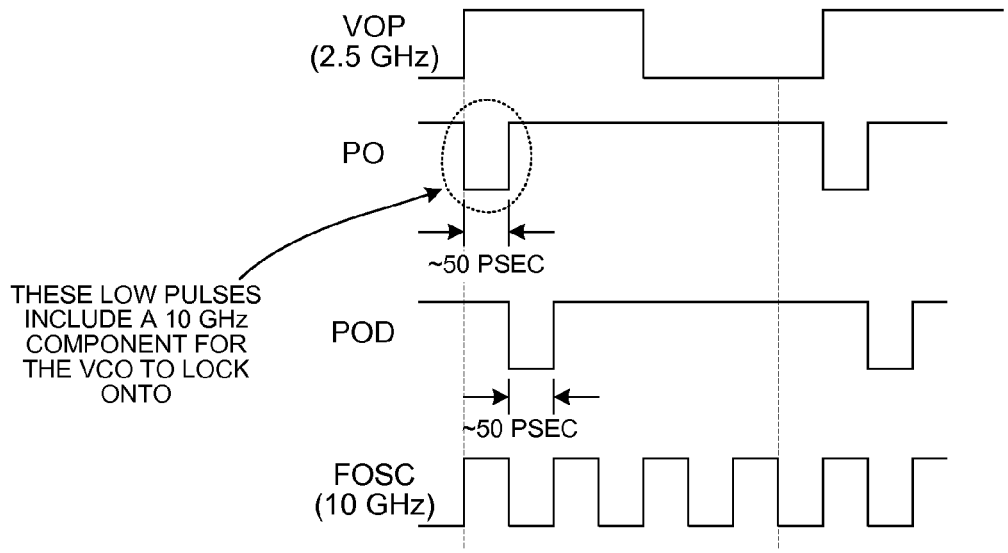
FIG. 8 is a waveform diagram that illustrates an operation of the circuit of FIG. 6.

FIG. 8 is a waveform diagram that illustrates operation of the pulse generator 145 of FIG. 6. On each rising edge of the incoming VOP signal on conductor 112, the pulse generator 145 generates a low pulse. The pulse width of these low pulses is approximately fifty picoseconds, and is determined by the propagation delay through inverter 163 in FIG. 6. The stream of low pulses is identified in FIG. 8 as waveform PO. In addition, in response to each rising edge of the incoming VOP signal, the pulse generator 145 generates a delayed version of the low pulse. The pulse width of these delayed low pulses is approximately fifty picoseconds, and is also determined by the propagation delay through inverter 163 in FIG. 6. The stream of these delayed low pulses is identified in FIG. 8 as waveform POD. The pulsing of the PO low pulses and the delayed POD low pulses causes the LC-based VCO 146 of FIG. 6 to oscillate at 10 GHz as described above. In FIG. 8, the waveform labeled FOSC illustrates the oscillating output signal present between the output nodes 155 and 156 of the LC-based oscillator 146.

Figure 9:
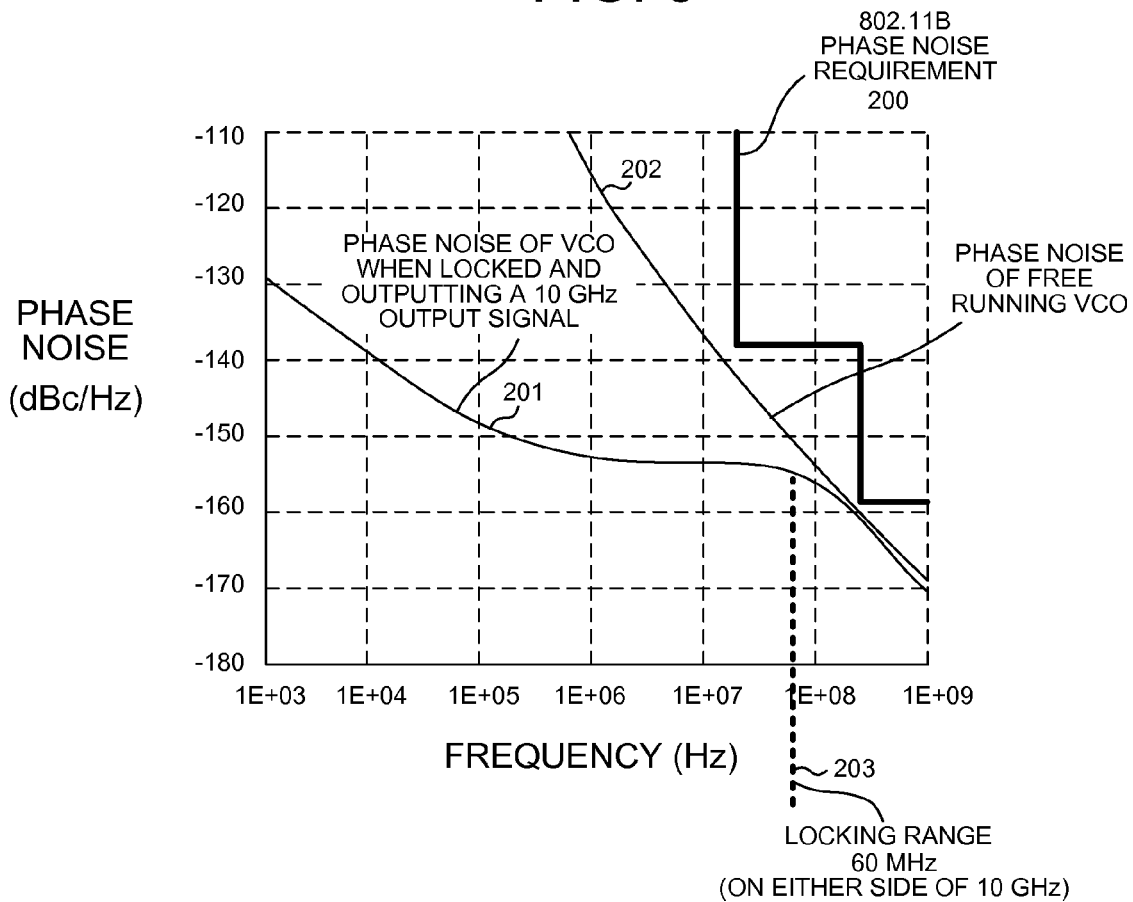
FIG. 9 is a graph that shows the phase margin performance of the circuit of FIG. 6.

FIG. 9 is a graph that shows how the phase noise of the 10 GHz FOSC signal output by the circuit of FIG. 6 meets an IEEE 802.11B phase noise requirement 200. The frequency offset from the 10 GHz fundamental of oscillating signal output by the LC-based VCO 146 is indicated in the horizontal dimension. Line 201 represents the phase noise of this signal, whereas line 202 represents the phase noise of the output of the LC-based VCO of FIG. 6 if the LC-based VCO were to be free running (i.e., not injection-locked to signal VOP). Vertical dashed line 203 indicates the locking range of the SHILO 136. SHILO 136 can lock onto a signal within a range of 10 GHz, plus or minus 60 MHz.

Figure 10:
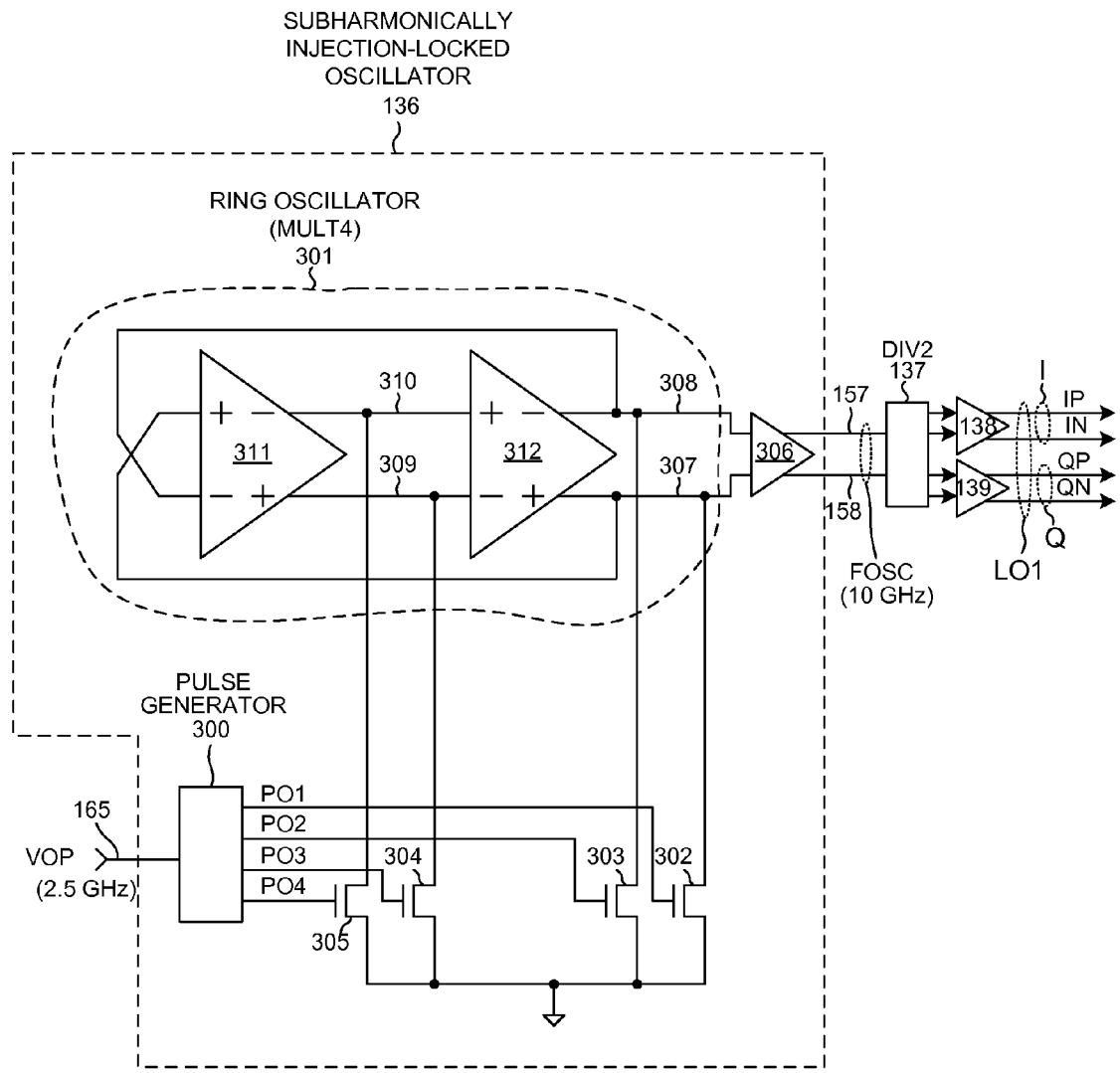
FIG. 10 is a circuit diagram of a second example of the SubHarmonically Injection-Locked Oscillator (SHILO) 136 in the circuit of FIG. 5.

FIG. 10 is a circuit diagram of a second example of SHILO 136 of FIG. 5. In this second example, SHILO is a Ring Oscillator-Based SubHarmonically Injection-Locked Oscillator and includes a pulse generator 300, a ring oscillator 301, a plurality of signal injection transistors 302-305, and an optional buffer 306. As in the case of the first example of FIG. 6, reference numerals 157 and 158 identify a pair of output leads of SHILO 136 and reference numeral 165 identifies the input lead of SHILO 136.

Figure 11:
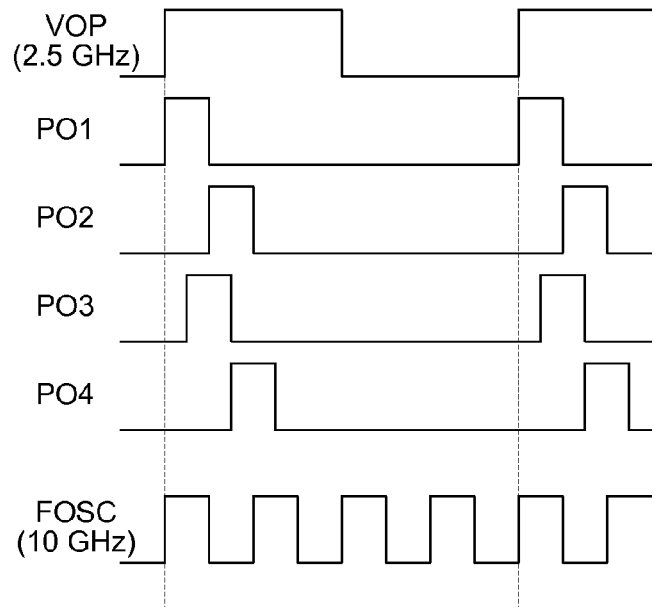
FIG. 11 is a waveform diagram that illustrates an operation of the circuit of FIG. 10.

FIG. 11 is a waveform diagram that illustrates an operation of the Ring Oscillator-Based SubHarmonically Injection-Locked Oscillator 136 of FIG. 10. In response to a rising edge of the incoming VOP signal, pulse generator 300 generates a set of high pulses that are spread out in time as indicated in FIG. 11. The pulse width of each of these high pulses is approximately fifty picoseconds. Four streams of pulses PO1, PO2, PO3 and PO4 are generated, and each of these streams of pulses is directed onto the gate of a corresponding respective one of the four injection pull-down N-channel transistors 302-305. These transistors 302-305 pull down on corresponding internal nodes 307-310 at the appropriate times such that the fourth harmonic of the incoming 2.5 GHz VOP input signal is injected into ring oscillator 301. Ring oscillator 301 therefore is made to oscillate at 10 GHz, and to output the 10 GHz signal FOSC. The triangle symbols 311 and 312 in FIG. 10 represent differential buffers.

Figure 12:
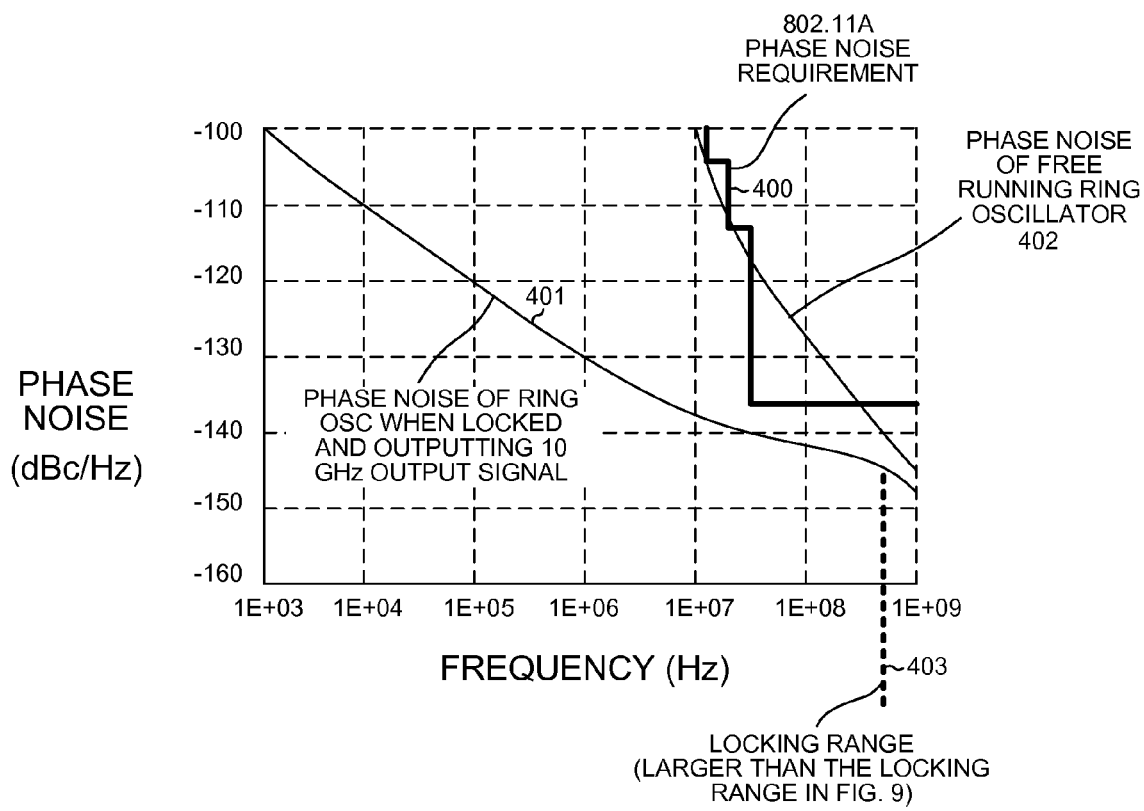
FIG. 12 is a graph that shows the phase margin performance of the circuit of FIG. 10.

FIG. 12 is a graph that shows how the phase noise of the 10 GHz FOSC signal output by the circuit of ring oscillator circuit FIG. 10 meets an IEEE 802.11A phase noise requirement 400. The frequency offset from the 10 GHz fundamental of the ring oscillator output signal is indicated in the horizontal dimension. Line 401 represents the phase noise of the ring oscillator output, whereas line 402 represents the phase noise of the ring oscillator if the ring oscillator were to be free running (i.e., not injection-locked to signal VOP). Vertical dashed line 403 indicates the locking range of SHILO 136. SHILO 136 can lock onto a signal within a range of 10 GHz plus or minus 600 MHz. The locking range of the ring oscillator example of FIG. 10 is therefore greater than the locking range of the LC-based VCO example of FIG. 6.

Figure 13:
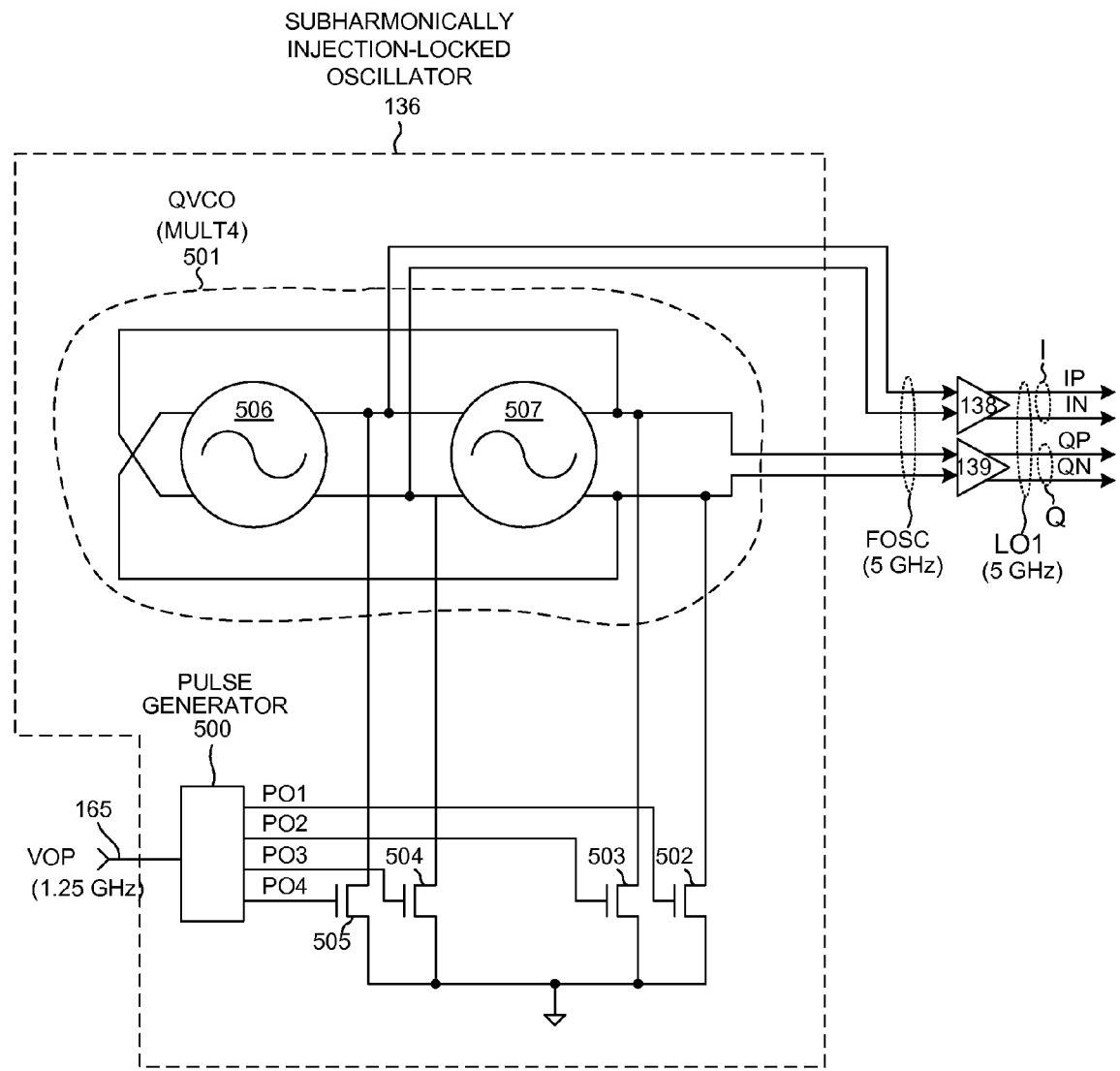
FIG. 13 is a circuit diagram of a third example of the SHILO 136 in the circuit of FIG. 5. This third example does not employ the divide-by-two and quadrature signal generator circuit 137 of FIG. 5. This third example involves a 1.25 GHz VOP signal on conductor 112 as opposed to the 2.25 GHz signal on conductor 112 in the examples of FIG. 6 and FIG. 10.

FIG. 13 is a circuit diagram of a third example of SHILO 136 of FIG. 5. In this example, SHILO is a Quadrature VCO-Based SubHarmonically Injection-Locked Oscillator and includes a pulse generator 500, an oscillator referred to here as a Quadrature VCO (QVCO) 501, and a plurality of signal injection transistors 502-505. The symbols 506 and 507 represent VCOs. VCOs 506 and 507 are coupled together as shown such that they frequency multiply by four and also generate a pair of differential signals I and Q. Signals I and Q have a quadrature phase relationship with respect to one another. Because QVCO 501 generates the I and Q signals, an additional quadrature signal generator divide-by-two circuit is not needed or provided on the output of the QVCO. Accordingly, for the same 5 GHz I and Q signals to be supplied to mixer 144 of FIG. 5, the QVCO of FIG. 13 need only oscillate at 5 GHz as compared to the oscillators in the examples of FIG. 6 and FIG. 10 where the oscillators 146 and 301 oscillate at 10 GHz. Because QVCO 501 frequency multiplies by four, the frequency of the incoming VOP signal on input lead 165 is only 1.25 GHz, as compared to the VOP frequency of 2.5 GHz in the examples of FIG. 6 and FIG. 10.

Figure 14:
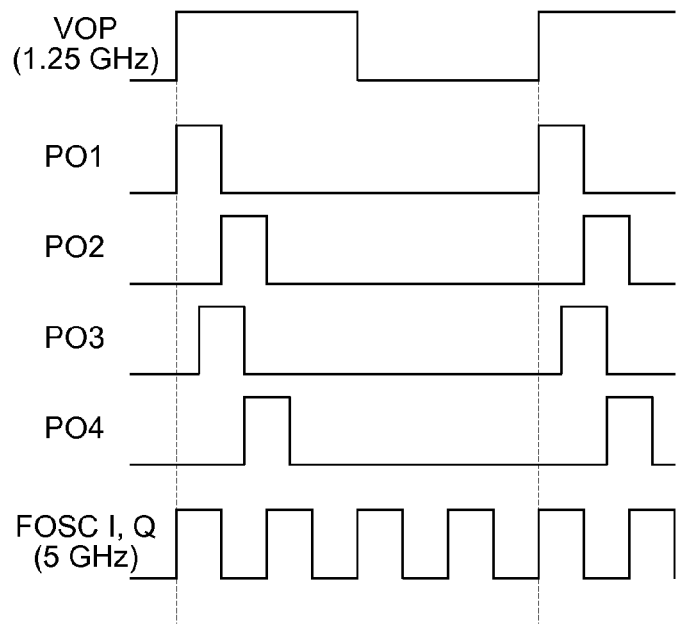
FIG. 14 is a waveform diagram that illustrates an operation of the circuit of FIG. 13.

FIG. 14 is a waveform diagram that illustrates an operation of the QVCO-based SubHarmonically Injection-Locked Oscillator of FIG. 13. In response to a rising edge of the incoming VOP signal, pulse generator 500 generates a set of high pulses that are spread out in time as indicated in FIG. 14. The pulse width of each of these high pulses is approximately one hundred picoseconds. Four streams of pulses PO1, PO2, PO3 and PO4 are therefore generated, and each of these streams of pulses is directed onto the gate of a corresponding respective one of the four injection pull-down N-channel transistors 502-505. These transistors 502-505 pull down on the internal nodes of the oscillator at the appropriate times such that the fourth harmonic of the 1.25 GHz VOP input signal is injected into QVCO 501. QVCO 501 therefore is made to oscillate at 5 GHz, and to output the two 5 GHz differential FOSC signals.

Figure 15:
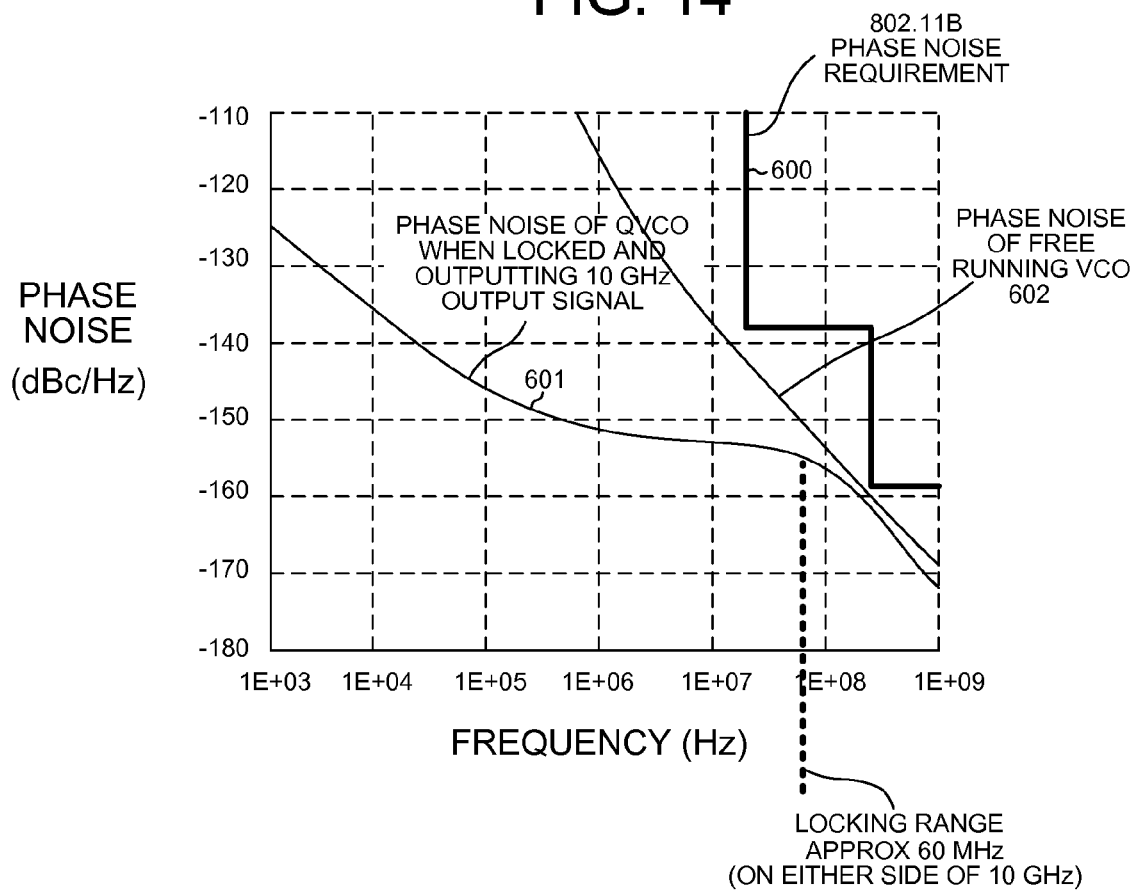
FIG. 15 is a graph that shows the phase margin performance of the circuit of FIG. 13.

FIG. 15 is a graph that shows how the phase noise of the 5 GHz I and Q FOSC signals output by QVCO 501 of FIG. 13 meets an IEEE 802.11B phase noise requirement 600. The frequency offset from the 10 GHz fundamental of ring oscillator output is indicated in the horizontal dimension. Line 601 represents the phase noise of the QVCO output, whereas line 602 represents the phase noise of the QVCO output if the QCO were to be free running (i.e., not injection-locked to signal VOP). Vertical dashed line 603 indicates the locking range of the SHILO 136. SHILO 136 can lock onto a signal within a range of approximately 60 MHz below 10 GHz to approximately 60 MHz above 10 GHz.

Figure 1:
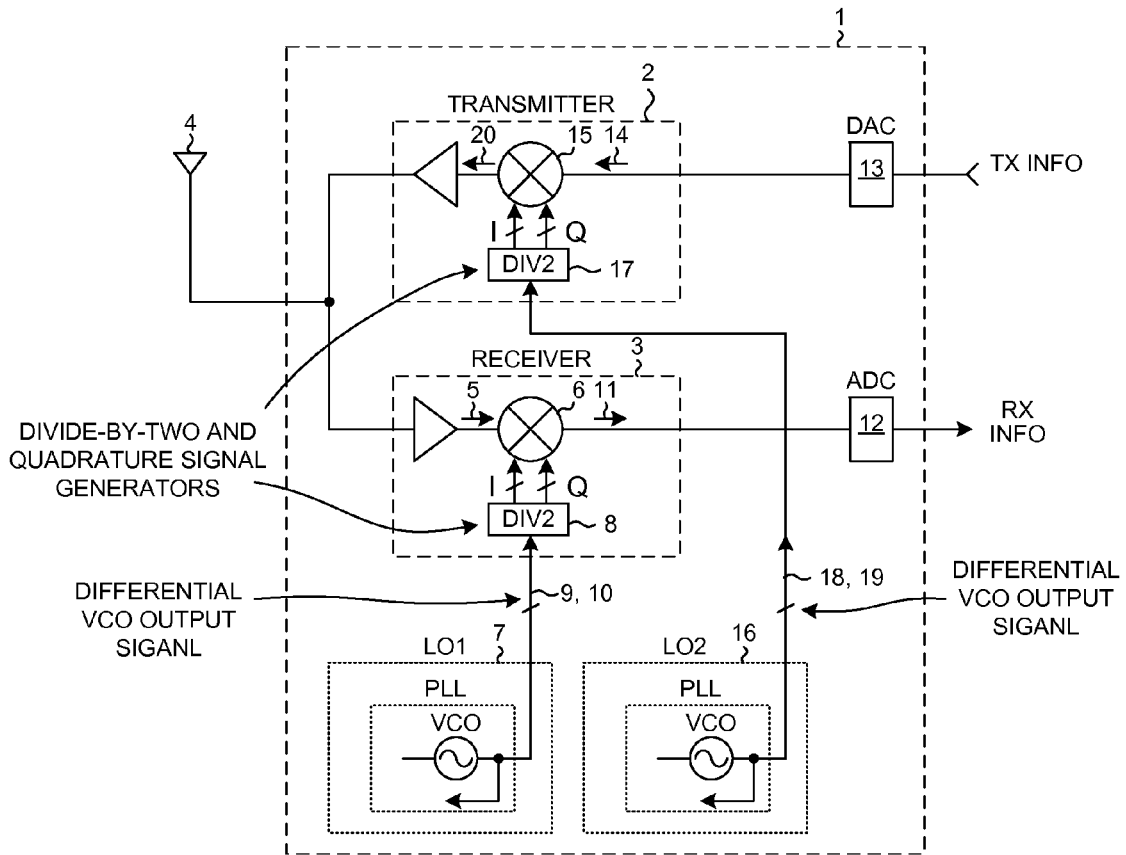
FIG. 1 (Prior Art) is a diagram that illustrates conventional circuitry for transmitting a signal from a local oscillator across an integrated circuit to a mixer.
Figure 2:
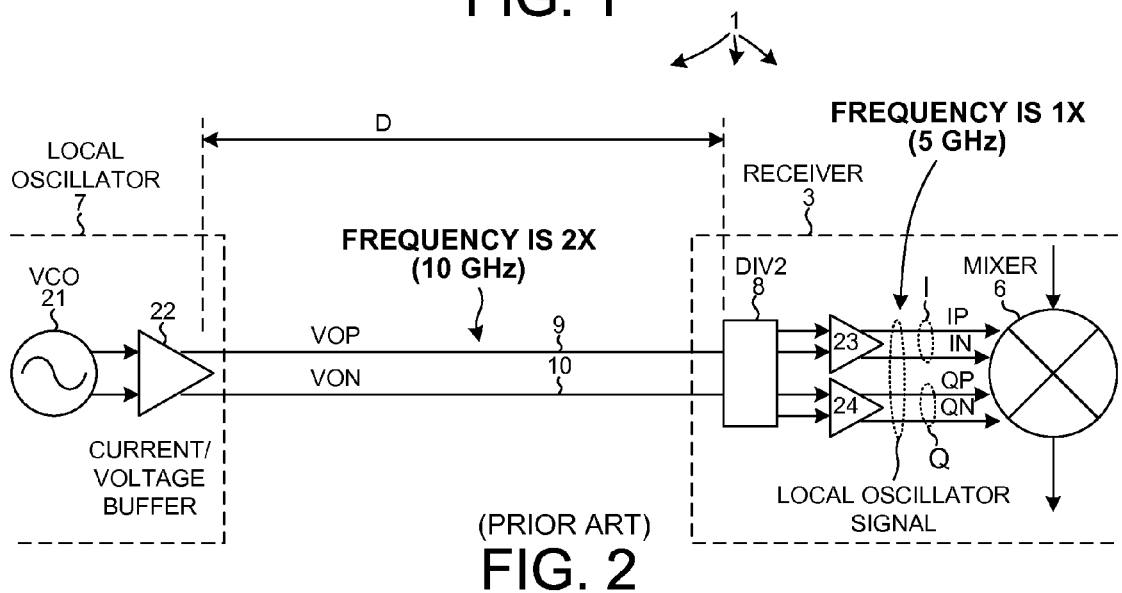
FIG. 2 (Prior Art) is a more detailed diagram of the conventional circuitry of FIG. 1.

FIG. 16 is a table that compares various performance parameters of the prior art circuit of FIG. 1 and FIG. 2, of the first example circuit of FIG. 6, of the second example circuit of FIG. 10, and of the third example circuit of FIG. 13. In each case, the local oscillator is assumed to be located approximately two millimeters away from the mixer on the same integrated circuit. The rows of current consumption numbers, proceeding from the upper row to the bottom row, are: 1) the current consumption of the oscillator in the SHILO in the example, 2) the current consumption of the following divide-by-two and quadrature generating circuit (if any), 3) the current consumption of the pulse generator within the SHILO (if any), 4) current consumption due to driving a high frequency signal onto and down the long conductor 112 to the mixer, and 5) the total power consumption. Note that the examples of FIG. 6, FIG. 10, and FIG. 13 consume substantially less total current than does the prior art circuit of FIG. 1 and FIG. 2. Of the three examples of FIG. 6, FIG. 10 and FIG. 13, the QVCO example of FIG. 13 has the lowest total power consumption but has the highest phase noise. The ring oscillator example of FIG. 10 as compared to the LC-based VCO of FIG. 6 is realized in a smaller IC area, has a wider locking frequency range, but has poorer phase noise performance.

Figure 17:
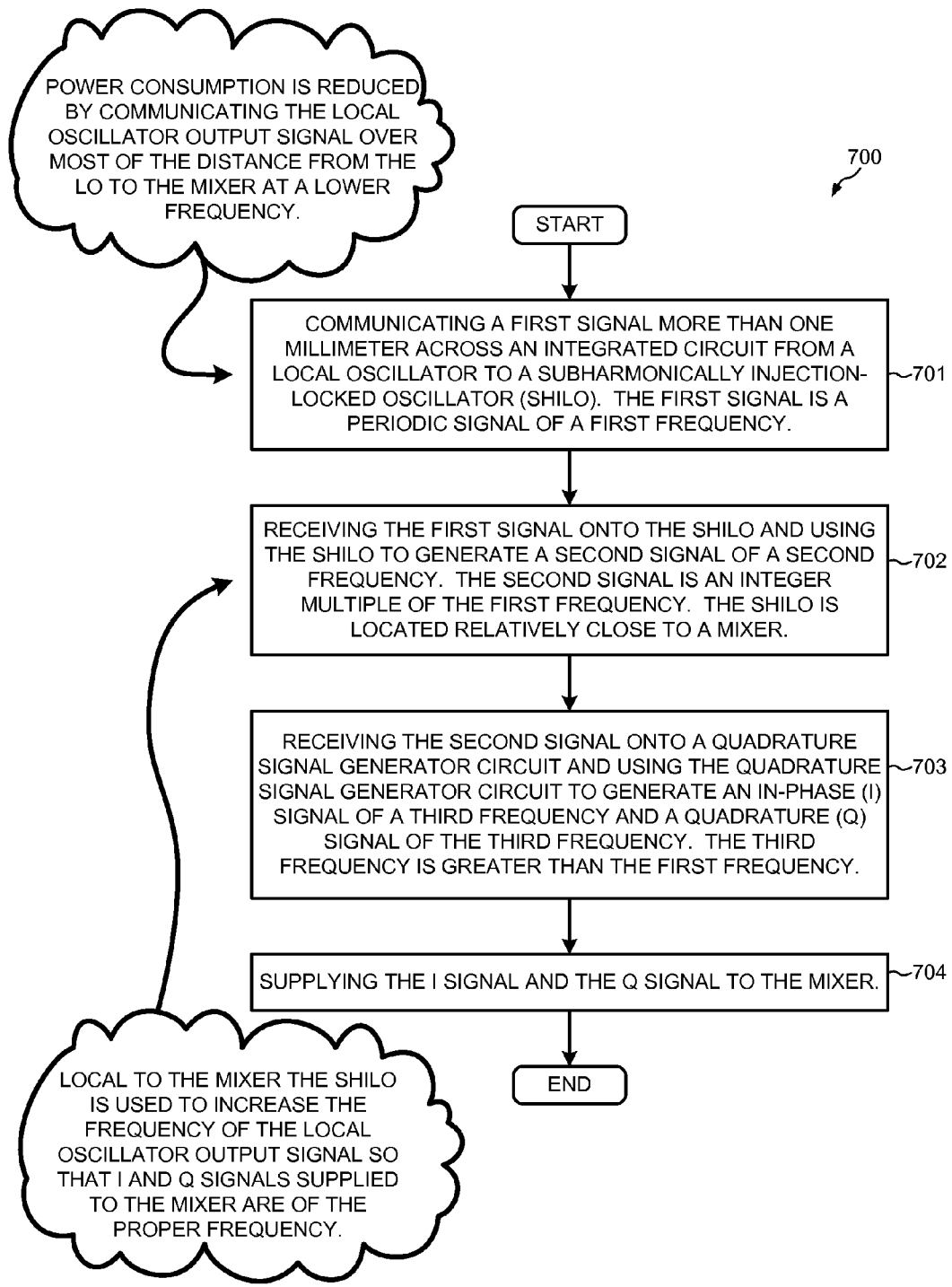
FIG. 17 is a flowchart of a method in accordance with one novel aspect.

FIG. 17 is a flowchart of a method 700 in accordance with one novel aspect. In a first step (step 701), a first signal is communicated a distance of more than one millimeter across an integrated circuit from a local oscillator to a frequency-multiplying SubHarmonically Injection-Locked Oscillator (SHILO). The first signal is a periodic signal of a first frequency. In one example of the method, the first signal is the signal VOP on conductor 112 in FIG. 5.

In a second step (step 702), the first signal is received onto the frequency-multiplying SHILO. The first signal is used by the SHILO to generate a second signal of a second frequency. The second signal is an integer multiple of the first frequency. The SHILO is located relatively close to the mixer, whereas the local oscillator is located at a remote location from the mixer. In one example of the method, the second signal is the signal FOSC in FIG. 5.

In a third step (step 703), the second signal is received onto a quadrature signal generator circuit. The quadrature signal generator circuit generates an in-phase (I) signal of a third frequency and a quadrature (Q) signal of the third frequency. The I and Q signals differ in phase by ninety degrees. The third frequency is greater than the first frequency. In one example of the method, the I and Q signals are the I and Q differential signals shown being supplied to the mixer 144 in FIG. 5. The third frequency of the I and Q signals is 5 GHz, whereas the first frequency of the VOP signal on conductor 112 is 2.5 GHz.

In a fourth step (step 704), the I and Q signals are supplied to the mixer. In one example of the method, the I and Q signals supplied to the mixer are the I and Q differential signals that are illustrated in FIG. 5 as being supplied to mixer 144.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one illustrative example, processor 129 of FIG. 3 executes the set of processor-executable instructions 130, thereby causing integrated circuit 103 to control operating parameters of the frequency-multiplying SHILO circuits mixer blocks 109 and 120.

Although certain specific embodiments are described above for instructional purposes, the teachings of this patent document have general applicability and are not limited to the specific embodiments described above. Although a single-ended signal VO is described as being communicated via conductor 112 from local oscillator 111 to mixer block 109, the signal communicated may be differential signal communicated via two conductors. The VO signal may be buffered by one or more buffers on its path from the local oscillator to the SHILO. The VO signal need not be generated by an analog VCO, but rather may be generated by another circuit in the local oscillator. In some examples, a signal is output by a Digitally-Controlled Oscillator (DCO), and this signal is divided by a divider in the local oscillator, and the resulting signal is the VO signal communicated at distance over more than one millimeter to the remotely located SHILO. Accordingly, various modifications, adaptations, and combinations of the various features of the described specific embodiments can be practiced without departing from the scope of the claims that are set forth below.

What is claimed is:

1. An integrated circuit comprising:
   a local oscillator including a phase-locked loop configured to output a first signal having a first frequency, the local oscillator configured to output a single-ended signal having a second frequency that is lower than the first frequency;
   a SubHarmonically Injection-Locked Oscillator (SHILO) configured to:
     receive the single-ended signal having the second frequency at an input terminal of the SHILO from an output terminal of the local oscillator; and
     generate a second signal based on the single-ended signal, wherein the second signal has a third frequency that is greater than the second frequency, and wherein the third frequency is less than or equal to the first frequency; and
   a quadrature signal generator configured to:
     receive the second signal having the third frequency at a set of input terminals of the quadrature signal generator from a set of output terminals of the SHILO; and
     generate, based on the second signal, a quadrature signal including an in-phase (I) signal having a fourth frequency and a quadrature-phase (Q) signal having the fourth frequency.

2. The integrated circuit of claim 1, wherein the single-ended signal is communicated a distance of at least one millimeter from the local oscillator to the SHILO.

3. The integrated circuit of claim 1, wherein the local oscillator is disposed more than one millimeter away from the SHILO, and wherein the fourth frequency is greater than the second frequency.

4. The integrated circuit of claim 1, further comprising:
   a mixer configured to receive the I signal and the Q signal.

5. The integrated circuit of claim 1, wherein the fourth frequency is half the third frequency.

6. The integrated circuit of claim 1, wherein the single-ended signal is a first periodic signal and the second frequency is a fundamental frequency of the first periodic signal, wherein the second signal is a second periodic signal and the third frequency is a fundamental frequency of the second periodic signal, and wherein the I signal and the Q signal are third periodic signals and the fourth frequency is a fundamental frequency of the third periodic signals.

7. The integrated circuit of claim 1, wherein the SHILO comprises:
   a pulse generator configured to:
     receive the single-ended signal at an input terminal of the pulse generator, wherein the input terminal of the pulse generator corresponds to the input terminal of the SHILO; and
     generate a pulse signal based on the single-ended signal; and
   an oscillator having a frequency lock range that includes the third frequency but does not include the second frequency, wherein the oscillator is configured to:
     receive the pulse signal at an input terminal of the oscillator from an output terminal of the pulse generator; and
     generate the second signal from the pulse signal.

8. The integrated circuit of claim 1, wherein the SHILO includes an oscillator, wherein the oscillator includes an LC tank circuit, and wherein the LC tank circuit includes an inductor and a capacitor.

9. The integrated circuit of claim 1, wherein the SHILO includes a ring oscillator or an injection-locked quadrature voltage controlled oscillator (QVCO).

10. The integrated circuit of claim 7, wherein the pulse signal includes a plurality of substantially identical pulses, wherein each pulse of the plurality of substantially identical pulses has a pulse width, and wherein the pulse width is related to a propagation delay of a circuit element in the pulse generator.

11. A method comprising:
receiving a single-ended signal having a second frequency at an input terminal of a SubHarmonically Injection-Locked Oscillator (SHILO) from an output terminal of a local oscillator configured to output the single-ended signal based on a first signal having a first frequency that is less than the second frequency, wherein the single-ended signal is a periodic signal;
generating, at the SHILO, a second signal based on the single-ended signal, wherein the second signal has a third frequency that is greater than the second frequency, and wherein the third frequency is less than or equal to the first frequency; and
providing the second signal from a set of output terminals of the SHILO to a set of input terminals of a quadrature signal generator circuit, wherein the quadrature signal generator circuit is configured to generate an in-phase (I) signal having a fourth frequency and a quadrature-phase (Q) signal having the fourth frequency.

12. The method of claim 11, wherein generating the second signal comprises:
generating a pulse signal based on the single-ended signal; and
supplying the pulse signal to an oscillator included in the SHILO, wherein the oscillator is configured to oscillate at the third frequency and to output the second signal.

13. The method of claim 11, wherein the SHILO includes an oscillator, wherein the oscillator includes an LC tank circuit, and wherein the LC tank circuit includes an inductor and a capacitor.

14. The method of claim 11, wherein the SHILO includes a ring oscillator.

15. An integrated circuit comprising:
a local oscillator including a phase-locked loop and a divider, the phase-locked loop configured to output a first signal having first frequency to the divider, and the local oscillator configured to output a single-ended periodic signal based on an output of the divider, the single-ended periodic signal having a second frequency that is lower than the first frequency;
a SubHarmonically Injection-Locked Oscillator (SHILO) that is disposed more than one millimeter away from the local oscillator, wherein the SHILO is configured to:
receive the single-ended periodic signal having the second frequency at an input terminal of the SHILO from an output terminal of the local oscillator; and
generate, based on the single-ended periodic signal, an in-phase (I) differential signal having a third frequency and a quadrature-phase (Q) differential signal having the third frequency, wherein the third frequency is greater than the second frequency, and wherein the third frequency is less than or equal to the first frequency; and
a mixer configured to receive the I differential signal and the Q differential signal at a set of input terminals of the mixer from a set of output terminals of the SHILO.

16. The integrated circuit of claim 15, wherein the SHILO is disposed less than one millimeter away from the mixer, and wherein the SHILO includes a Quadrature Voltage-Controlled Oscillator (QVCO).

17. A method comprising:
receiving a single-ended periodic signal having a second frequency at an input terminal of a SubHarmonically Injection-Locked Oscillator (SHILO) from an output terminal of a local oscillator configured to output the single-ended periodic signal having the second frequency based on a first signal having first frequency that is less than the second frequency, and wherein the SHILO is disposed more than one millimeter away from the local oscillator;
at the SHILO, generating, based on the single-ended periodic signal, an in-phase (I) differential signal and a quadrature-phase (Q) differential signal, wherein the I differential signal and the Q differential signal have a third frequency that is greater than the second frequency, and wherein the third frequency is less than or equal to the first frequency; and
supplying the I differential signal and the Q differential signal from a set of output terminals of the SHILO to a set of input terminals of a mixer.

18. The method of claim 17, wherein the SHILO is disposed substantially less than one millimeter away from the mixer, wherein the SHILO includes a Quadrature Voltage-Controlled Oscillator (QVCO).

19. The integrated circuit of claim 1, wherein the single-ended signal is communicated a distance of at least two millimeters from the local oscillator to the SHILO.

20. The integrated circuit of claim 1, wherein the third frequency is four times the second frequency, and wherein the fourth frequency is half the third frequency.

21. The integrated circuit of claim 1, wherein the local oscillator is configured to determine the second frequency of the single-ended signal based on a control input signal.

22. An apparatus comprising:
means for generating a single-ended signal having a second frequency based on an output of a phase-locked loop configured to output a first signal having a first frequency;
means for generating a second signal based on the single-ended signal, the single-ended signal received at an input terminal of the means for generating the second signal from an output terminal of the means for generating the single-ended signal, the second signal having a third frequency that is greater than the second frequency, wherein the third frequency is less than or equal to the first frequency and wherein the single-ended signal is communicated a distance of at least one millimeter from the means for generating the single-ended signal to the means for generating the second signal; and
means for generating a quadrature signal based on the second signal, the quadrature signal including an in-phase (I) signal having a fourth frequency and a quadrature-phase (Q) signal having the fourth frequency.

23. The apparatus of claim 22, wherein the third frequency is four times the second frequency, and wherein the fourth frequency is half the third frequency.

24. The apparatus of claim 22, wherein the second signal is a non-quadrature signal.

25. The integrated circuit of claim 1, wherein the SHILO comprises:
a pulse generator configured to:
receive the single-ended signal; and
generate four pulse output signals based on the single-ended signal;
four n-type metal oxide semiconductor (NMOS) transistors, wherein each pulse output signal of the four pulse output signals is coupled to drive a gate of a corresponding NMOS transistor of the four NMOS transistors, and wherein a source of each NMOS transistor of the four NMOS transistors is coupled to ground; and a ring oscillator comprising a first differential buffer and a second differential buffer, wherein a first drain of a first NMOS transistor of the four NMOS transistors is coupled to a first output terminal of the first differential buffer, wherein a second drain of a second NMOS transistor of the four NMOS transistors is coupled to a second output terminal of the first differential buffer, wherein a third drain of a third NMOS transistor of the four NMOS transistors is coupled to a first output terminal of the second differential buffer, wherein a fourth drain of a fourth NMOS transistor of the four NMOS transistors is coupled to a second output terminal of the second differential buffer, and wherein the pulse generator and the four NMOS transistors are external to the first differential buffer and the second differential buffer.

26. The integrated circuit of claim 25, wherein the first output terminal of the second differential buffer is coupled to a first input terminal of the first differential buffer, wherein the second output terminal of the second differential buffer is coupled to a second input terminal of the first differential buffer, wherein the first output terminal of the first differential buffer is coupled to a second input terminal of the second differential buffer, and wherein the second output terminal of the first differential buffer is coupled to a first input terminal of the second differential buffer.

27. The integrated circuit of claim 1, wherein the output terminal of the local oscillator is coupled to the input terminal of the SHILO.

* * * * *